United States Patent
Wei et al.

(10) Patent No.: US 12,394,593 B2
(45) Date of Patent: Aug. 19, 2025

(54) POWER CONTROL METHOD AND DEVICE OF LOWER RADIO FREQUENCY POWER SUPPLY AND SEMICONDUCTOR PROCESSING EQUIPMENT

(71) Applicant: BEIJING NAURA MICROELECTRONICS EQUIPMENT CO., LTD., Beijing (CN)

(72) Inventors: Jing Wei, Beijing (CN); Yu Zhang, Beijing (CN); Gang Wei, Beijing (CN); Guodao Shan, Beijing (CN); Chenyu Zhong, Beijing (CN); Yanyan You, Beijing (CN); Jing Yang, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 36 days.

(21) Appl. No.: 18/616,998

(22) Filed: Mar. 26, 2024

(65) Prior Publication Data

US 2024/0234088 A1    Jul. 11, 2024

Related U.S. Application Data

(63) Continuation of application No. PCT/CN2022/120101, filed on Sep. 21, 2022.

(30) Foreign Application Priority Data

Sep. 26, 2021    (CN) .......................... 202111126996.7

(51) Int. Cl.
*H01J 37/32*    (2006.01)

(52) U.S. Cl.
CPC ...... *H01J 37/321* (2013.01); *H01J 37/32183* (2013.01); *H01J 37/32577* (2013.01)

(58) Field of Classification Search
None
See application file for complete search history.

(56) References Cited

U.S. PATENT DOCUMENTS

| 6,101,970 A | * | 8/2000 | Koshimizu | ....... H01L 21/67069 |
| | | | | 118/723 AN |
| 11,075,088 B2 | * | 7/2021 | Park | ................. H01J 37/32091 |

(Continued)

FOREIGN PATENT DOCUMENTS

| CN | 101996840 A | 3/2011 |
| CN | 104281185 A | 1/2015 |

(Continued)

OTHER PUBLICATIONS

The World Intellectual Property Organization (WIPO) International Search Report for PCT/CN2022/120101 Dec. 27, 2022 5 Pages (including translation).

*Primary Examiner* — Srinivas Sathiraju
(74) *Attorney, Agent, or Firm* — ANOVA LAW GROUP, PLLC

(57) ABSTRACT

A power control method of a lower RF power supply of semiconductor processing equipment includes, when a processing chamber starts semiconductor processing, with a predetermined power compensation equation and according to a pre-obtained first RF circuit parameter set of a reference chamber and a second RF circuit parameter set of a present processing chamber performing the semiconductor processing, obtaining a power compensation coefficient of the present processing chamber relative to the reference chamber, according to the power compensation coefficient and a power setting value of the lower RF power supply of the present processing chamber, calculating a power compen- (Continued)

sation value of the present processing chamber relative to the reference chamber, and controlling the lower RF power supply to output the power compensation value.

11 Claims, 9 Drawing Sheets

(56) References Cited

U.S. PATENT DOCUMENTS

| | | | |
|---|---|---|---|
| 11,075,089 B2* | 7/2021 | Park | H01J 37/32165 |
| 11,705,313 B2* | 7/2023 | Hirayama | H01J 37/32311 |
| | | | 315/111.21 |
| 11,923,174 B2* | 3/2024 | Kitamura | H01J 37/3299 |
| 11,961,712 B2* | 4/2024 | Winter | H01J 37/32183 |
| 2006/0220574 A1* | 10/2006 | Ogawa | H01J 37/32183 |
| | | | 315/111.21 |
| 2017/0067779 A1* | 3/2017 | Kim | H01L 21/67253 |
| 2017/0084427 A1* | 3/2017 | Um | H01J 37/3266 |
| 2017/0229312 A1* | 8/2017 | Park | H01J 37/32091 |
| 2019/0148119 A1* | 5/2019 | Sung | H01L 21/6833 |
| | | | 156/345.48 |
| 2020/0234964 A1* | 7/2020 | Park | H01L 21/3065 |
| 2020/0234965 A1* | 7/2020 | Park | H01J 37/32165 |
| 2021/0057188 A1 | 2/2021 | Ni et al. | |
| 2024/0234088 A1* | 7/2024 | Wei | H01J 37/32577 |

FOREIGN PATENT DOCUMENTS

| | | |
|---|---|---|
| CN | 106328550 A | 1/2017 |
| CN | 113113282 A | 7/2021 |

\* cited by examiner

POWER CONTROL METHOD AND DEVICE OF LOWER RADIO FREQUENCY POWER SUPPLY AND SEMICONDUCTOR PROCESSING EQUIPMENT

CROSS-REFERENCES TO RELATED APPLICATIONS

This application is a continuation application of International Application No. PCT/CN2022/120101, filed on Sep. 21, 2022, which claims priority to Chinese Application No. 202111126996.7 filed on Sep. 26, 2021, the entire contents of all of which are incorporated herein by reference.

TECHNICAL FIELD

The present disclosure generally relates to the semiconductor manufacturing field and, more particularly, to a power control method and a power control device for a lower radio frequency power supply in semiconductor processing equipment, and the semiconductor processing equipment.

BACKGROUND

As the feature size of integrated circuits continues to decrease, the requirements for processing technology become increasingly strict. One important requirement is product consistency. During the processing process, strict requirements are placed on the consistency of the process results for all chambers in the semiconductor processing equipment of the same model to avoid process risks caused by consistency issues of the chambers. Therefore, strict process control is needed among different chambers to implement consistency in process results.

Taking inductively coupled plasma equipment as an example, the lower RF power supply loads the RF energy to the lower electrode (e.g., electrostatic chuck) through a matcher. Thus, an RF bias voltage is generated on the wafer surface to accelerate the etching of the ions on the wafer. When the RF power output by the lower RF power supply to the RF power changes, the bias voltage generated at the wafer can change, and the final etching processing result can change too. Thus, the consistency of the overall efficiency of the lower electrode RF circuit can be closely related to the processing result.

The power loss generated in the process from outputting the RF power by the lower electrode power supply until the RF power is adopted by the plasma includes matcher loss, loss of the lower electrode for the ground capacity, and circuit contact loss. Among different chambers, since the matchers, lower electrode, and mounting contact resistance can be different in the lower RF circuit, the equivalent resistance and capacity of various parts of the lower electrode RF circuit can be different. That is, the power loss can be different. Thus, among different chambers, when the output powers of the lower electrode power supplies are the same, the power losses can be different. The power adopted by plasma can be different too. Thus, the generated RF bias voltages can be different, which affects the consistency of the processing result.

SUMMARY

As a first aspect, the present disclosure provides a power control method of a lower RF power supply of semiconductor processing equipment. The method includes, when a processing chamber starts semiconductor processing, with a predetermined power compensation equation and according to a pre-obtained first RF circuit parameter set of a reference chamber and a second RF circuit parameter set of a present processing chamber performing the semiconductor processing, obtaining a power compensation coefficient of the present processing chamber relative to the reference chamber, according to the power compensation coefficient and a power setting value of the lower RF power supply of the present processing chamber, calculating a power compensation value of the present processing chamber relative to the reference chamber, and controlling the lower RF power supply to output the power compensation value.

As a second aspect, the present disclosure further provides a processing chamber, a matcher, a lower RF power supply, and a power control device. A lower electrode is arranged in the processing chamber. The lower electrode is electrically connected to the lower RF power supply through the matcher. The power control device includes a calculator and a controller. The calculator is configured to, when a processing chamber starts semiconductor processing, with a predetermined power compensation equation and according to a pre-obtained first RF circuit parameter set of a reference chamber and a second RF circuit parameter set of a present processing chamber performing the semiconductor processing, obtain a power compensation coefficient of the present processing chamber relative to the reference chamber, and according to the power compensation coefficient and a power setting value of the lower RF power supply of the present processing chamber, calculate a power compensation value of the present processing chamber relative to the reference chamber. The controller is configured to control the lower RF power supply to output the power compensation value.

The present disclosure has the following beneficial effects.

In the technical solution of the power control method and device of the lower RF power supply in the semiconductor processing equipment of embodiments of the present disclosure, when the processing chamber starts the semiconductor processing, with the pre-determined power compensation equation and according to the pre-obtained first RF circuit parameter set and the second RF circuit parameter set of the present processing chamber performing the semiconductor processing, the power compensation coefficient can be obtained. According to the power compensation coefficient and the power setting value of the lower RF power supply of the present processing chamber, the power compensation value can be calculated. Then, the lower RF power supply can be controlled to output the power compensation value. Thus, the difference in the power utilized by the plasma between the other processing chambers except for the reference chamber and the reference chamber can be compensated. Thus, the consistency in the bias voltage values generated on the wafers between different chambers under the same processing recipe can be improved. Thus, the processing result consistency of the different processing chambers can be improved.

The semiconductor processing equipment of the present disclosure, by adopting the power control device of the present disclosure, can improve the consistency of the bias voltage value generated on the wafer among different chambers under the same processing recipe to improve the consistency of processing results among different process chambers.

DETAILED DESCRIPTION OF THE EMBODIMENTS

To help those skilled in the art better understand the technical solution of the present disclosure, a power control method and a power control device of lower radio frequency (RF) power supply in semiconductor processing equipment and the semiconductor processing equipment are described in detail below in conjunction with the accompanying drawings.

Figure 1:
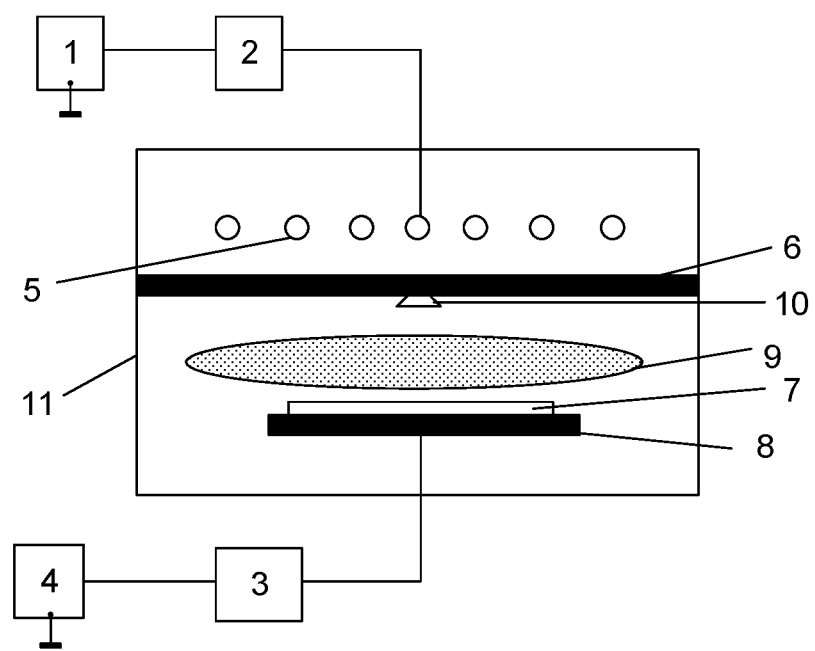
FIG. 1 illustrates a schematic structural diagram of an inductively coupled plasma equipment.

FIG. 1 illustrates a schematic structural diagram of an inductively coupled plasma equipment. As shown in FIG. 1, the equipment includes a processing chamber 11. A dielectric window 6 is arranged at the top of the processing chamber. An inductive coupling coil 5 is arranged above the dielectric window 6. The inductive coupling coil 5 is electrically connected to an upper RF power supply 1 via an upper matcher 2. The upper RF power supply 1 can apply RF power onto the inductive coupling coil 5 via the upper matcher 2 to excite a process gas in the processing chamber 11 to form a plasma 9. Additionally, a lower electrode 8 (e.g., an electrostatic chuck) is arranged in processing chamber 11 and is configured to carry a wafer 7. The lower electrode 8 is electrically connected to a lower RF power supply 4 via a lower matcher 3. The lower RF power supply 4 is configured to apply RF power onto the lower electrode 8 to generate an RF bias voltage on the wafer surface to accelerate ions to etch the wafer 7.

When the RF power of the lower RF power supply 4 is applied to the electrostatic chuck 8, a corresponding RF bias voltage is formed on the wafer 7. The RF bias voltage can be used to accelerate the ions to perform an etching process. When the applied RF power is different, the magnitude of the bias voltage on the wafer 7 can be changed, and the final etching process result can be changed. Thus, the overall efficiency consistency of the lower electrode circuit can be closely related to the process results.

Figure 2A:
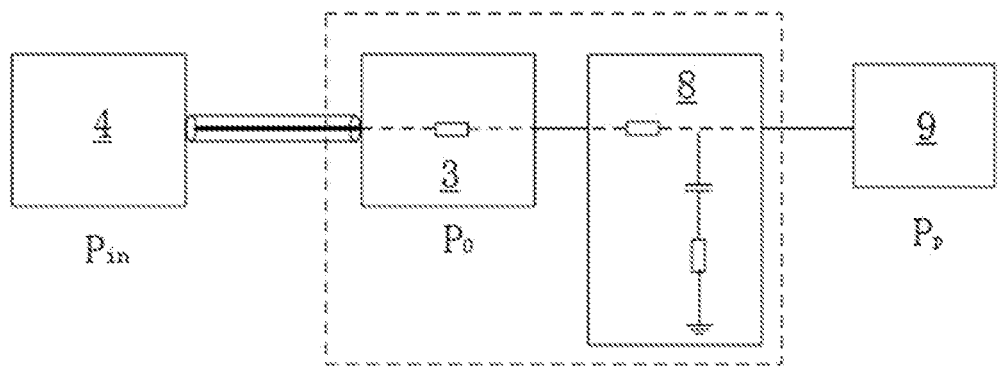
FIG. 2A illustrates a schematic diagram showing radio frequency (RF) power loss in a lower electrode RF circuit in FIG. 1.

FIG. 2A illustrates a schematic diagram showing radio frequency (RF) power loss in a lower electrode RF circuit in FIG. 1. As shown in FIG. 2A, the power loss during the process from the RF power output from the lower RF power supply 4 to the power utilized by the plasma 9 mainly includes losses in the matcher, losses in the lower electrode to ground capacitance, losses in circuit contact, etc. In some embodiments, if the output power of the lower RF power supply 4 is $P_{in}$, the total power loss of the lower electrode RF circuit can be $P_0$, and the remaining power utilized by the plasma 9 can be $P_p$, $P_p=P_{in}-P_0$. Then, the power transmission efficiency of the lower electrode RF circuit can be $\eta$, $\eta=P_p/P_{in}$.

Figure 2B:
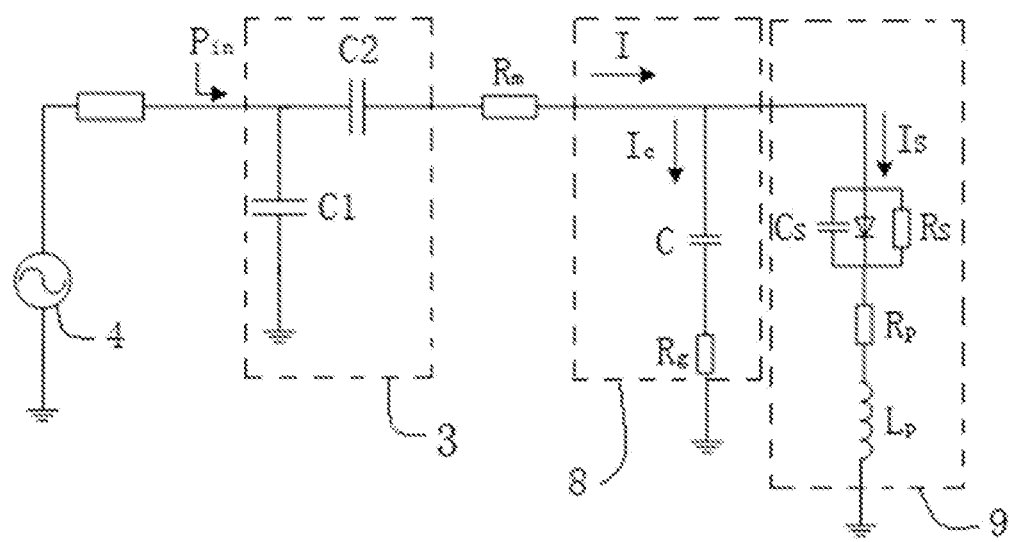
FIG. 2B illustrates an equivalent circuit diagram of the lower electrode RF circuit in FIG. 1.

FIG. 2B illustrates an equivalent circuit diagram of the lower electrode RF circuit in FIG. 1. As shown in FIG. 2B, capacitor C1 and capacitor C2 are variable capacitors in lower matcher 3. A loss resistance of the lower matcher 3 and a contact resistance of the lower electrode RF circuit as a whole can be considered as a loss equivalent resistance $R_m$ of the lower electrode RF circuit. The loss equivalent resistance $R_m$ is connected in series in the main path of the lower electrode RF circuit. Moreover, an equivalent circuit connected to an output end of the main path can include two parallel branches. One of the branches can be a lower electrode-to-ground branch. The lower electrode-to-ground branch can include a lower electrode-to-ground capacitance C and an equivalent resistance $R_g$ when the lower electrode is grounded. The other branch can be a plasma sheath branch. The plasma sheath branch can include an impedance real part $R_p$ and an equivalent inductance $L_p$ of an impedance imaginary part of the plasma 9, and an impedance real part $R_s$ and an equivalent capacitance $C_s$ of an impedance imaginary part of the plasma sheath. Additionally, the current in the lower electrode-to-ground branch can be $I_c$, the current in the plasma sheath branch can be $I_s$, and the current at the output end of the lower matcher 3 in the main path of the lower electrode RF circuit can be I. The current I can be equal to the sum of the currents $I_c$ and $I_s$.

Since among different chambers, the matcher in the lower electrode RF circuit, the lower electrode, the installation contact resistance, etc., are different, the equivalent resistance and capacitance of the parts of the lower electrode RF circuit can be different among different chambers. That is, the total power loss $P_0$ in the lower electrode RF circuit can be different. Thus, among different chambers, when the output power $P_{in}$ of the lower RF power supply is the same, and the total power loss $P_0$ is different, the remaining power $P_p$ utilized by the plasma 9 (the power transmission efficiency $\eta$) can be different. Then, the RF bias voltage generated on the wafer surface can be different, which affects the consistency of the processing results.

Figure 3:
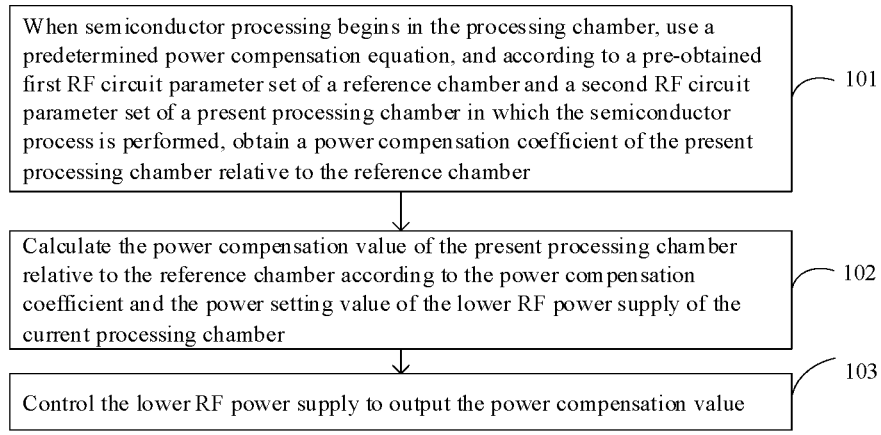
FIG. 3 illustrates a schematic block diagram of a power control method of a lower RF power supply in semiconductor processing equipment according to embodiments of the present disclosure.

To address the above problem, FIG. 3 illustrates a schematic block diagram of a power control method of a lower RF power supply in semiconductor processing equipment according to embodiments of the present disclosure. The method includes the following steps.

At 101, when semiconductor processing begins in the processing chamber, with predetermined power compensation equation, and according to a pre-obtained first RF circuit parameter set of a reference chamber and a second RF circuit parameter set of a present processing chamber in which the semiconductor process is performed, a power compensation coefficient of the present processing chamber is obtained relative to the reference chamber.

The reference chamber above can be one chamber specified from a plurality of chambers with the same structure. The first RF circuit parameter set of the reference chamber can refer to a combination of feature parameters of the lower electrode of the reference chamber. This first RF circuit parameter set can include but is not limited to the current at the output end of the lower matcher 3 in the main path of the lower electrode RF circuit, the current in the plasma sheath branch of the lower electrode RF circuit, the loss equivalent resistance and the ground equivalent resistance of the lower electrode RF circuit, and the lower electrode-to-ground capacitance.

The present processing chamber above can be other processing chambers with the same structure except the reference chamber. When processing is performed in other process chambers, compensation can be performed on the output power of the lower RF power supply 4 according to the inherent parameter of the processing chambers (i.e., the second RF circuit parameter set) and in connection with the inherent parameter and the plasma sheath parameter of the reference chamber (i.e., the first RF circuit parameter set) to achieve that the RF bias voltage generated on the wafer surface when the processing is performed in the other processing chambers with the same structure is consistent with the reference chamber. The second RF circuit parameter set of the present processing chamber can include but is not limited to the loss equivalent resistance and the grounded equivalent resistance of the lower RF circuit and the lower electrode-to-ground capacitance.

It should be noted that whether for the reference chamber or other process chambers, the inherent parameters such as the loss equivalent resistance $R_m$, the grounded equivalent resistance $R_g$, and the lower electrode-to-ground capacitance C can remain unchanged when performing the processing. The plasma sheath parameter of the lower electrode RF circuit (e.g., the RF bias voltage and the current in the plasma sheath branch) can change with different processing processes. The current $I_c$ in the lower electrode-to-ground branch is made of most of the current I (usually greater than 10 amperes). However, the current $I_s$ in the plasma sheath branch can be small (smaller than 1 ampere). Thus, the current $I_s$ in the plasma sheath branch can be regarded as a constant current. Since the remaining power $P_p$ utilized by the plasma 9 (also referred to as absorption power) is a product of the RF bias voltage and the current $I_s$ in the plasma sheath branch, the remaining power $P_p$ can also change with the processing. Based on this, the lower electrode loss feature of different chambers can be reflected by the inherent parameters and the plasma sheath parameters. The difference in the remaining power $P_p$ between the other processing chambers and the reference chamber can be compensated according to the lower electrode loss feature to allow different chambers to have the same remaining power $P_p$. Thus, the RF bias voltages of different chambers can be ensured to be consistent, and the processing results can be consistent.

Figure 4A:
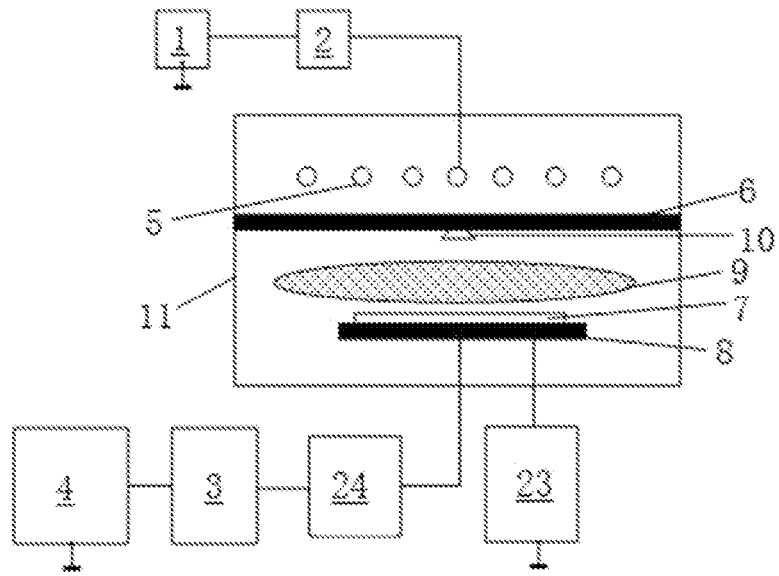
FIG. 4A illustrates a schematic structural diagram of semiconductor processing equipment according to embodiments of the present disclosure.

In some optional embodiments, as shown in FIG. 4A, based on the inductively coupled plasma equipment shown in FIG. 1, a current detection unit 24 is further arranged in the circuit between the output end of the lower matcher 3 and the lower electrode 8 and is configured to detect the current I at the output end of the lower matcher 3 in the main path of the lower electrode RF circuit. Additionally, voltage detection unit 23 is connected to the lower electrode 8 and is configured to detect the RF bias voltage on the wafer surface. Furthermore, a capacitance detection unit (not shown in the figure) can be connected to the lower electrode-to-ground branch and be configured to detect the lower electrode-to-ground capacitance C.

Figure 4B:
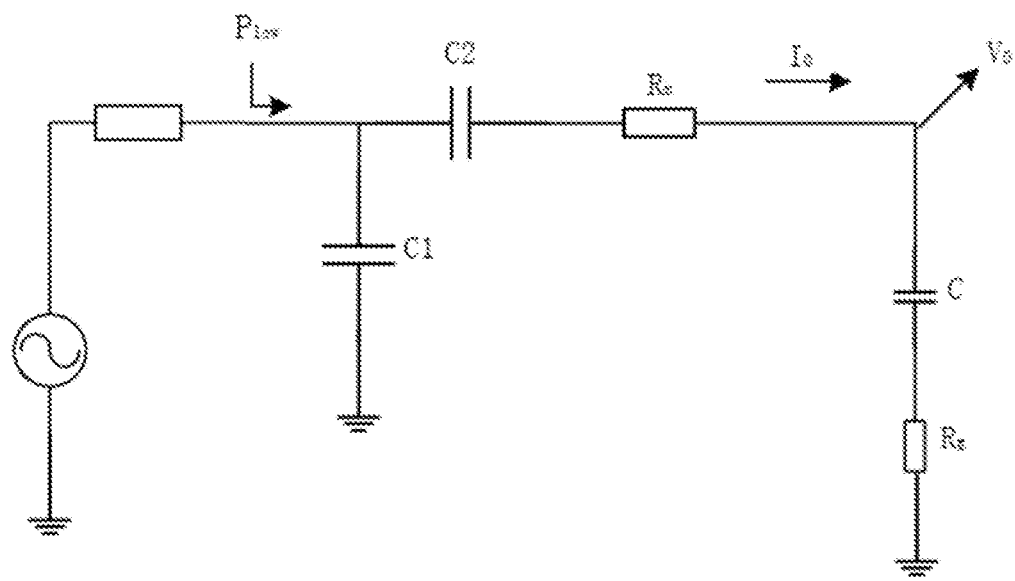
FIG. 4B illustrates a schematic equivalent circuit diagram of the lower electrode RF circuit in FIG. 4A when outputting a determined power.

Taking the inductively coupled plasma equipment shown in FIG. 4A as an example, as shown in FIG. 4B, corresponding to each processing chamber (including the reference chamber and other processing chambers), the following acquisition method can be used to obtain the loss equivalent resistance $R_m$ and the grounded equivalent resistance $R_g$.

At 201, the lower RF power supply 4 of the processing chamber (the upper RF power supply 1 is turned off) is turned on to apply a power setting value Plow on the lower electrode 8 via the lower matcher 3.

The power setting value $P_{low}$ can be lower than the power value normally used in the processing. When the power setting value $P_{low}$ is applied onto the lower electrode 8, the determined power $P_{low}$ can be almost fully consumed by the lower electrode-to-ground branch when the lower matcher 3 performs matching. Since the upper RF power supply 1 is turned off, and the power setting value $P_{low}$ is low, the power may not be sufficient to cause the plasma in the processing chamber to ignite. Thus, no plasma load can be generated.

At 202, the current at the output end of the matcher (i.e., the lower matcher 3) in the main path of the lower electrode RF circuit, the present bias voltage value of the lower electrode 8, and the lower electrode-to-ground capacitance are detected.

In step 202, the current detection unit 24 can be configured to detect the current $I_0$ at the output end of the matcher in the main path of the lower electrode RF circuit. The voltage detection unit 23 can be configured to detect the present bias voltage value $V_0$ of the lower electrode 8, and the capacitance detection unit can be configured to detect the lower electrode-to-ground capacitance C.

In some embodiments, the equation (1) of the power setting value $P_{low}$ is:

$$P_{low} = I_0^2 (R_m + R_g) \tag{1}$$

The equation (2) of the present bias voltage value $V_0$ of the lower electrode 8 is:

$$V_0 = I_0 \sqrt{R_g^2 + \left(\frac{1}{\omega C}\right)^2} \tag{2}$$

The following equations (3) and (4) are derived using the above equations (1) and (2).

$$R_g = \sqrt{\left(\frac{V_0}{I_0}\right)^2 - \left(\frac{1}{\omega C}\right)^2} \tag{3}$$

-continued $$R_m = \frac{P_{low}}{I_0^2} - R_g \quad (4)$$

where, $R_g$ denotes the grounded equivalent resistance of the lower electrode RF circuit, $R_m$ denotes the loss equivalent resistance of the lower electrode RF circuit, $V_0$ denotes the present bias voltage value, $I_0$ denotes the present current, $\omega$ denotes an angular frequency, C denotes the lower electrode-to-ground capacitance, and $P_{low}$ denotes the power setting value.

At 203, using the above equations (3) and (4), and according to the present current $I_0$, the present bias voltage value $V_0$, and lower electrode-to-ground capacitance C, the loss equivalent resistance $R_m$ and the grounded equivalent resistance $R_g$ of the lower electrode RF circuit are calculated.

Of course, in practical applications, the loss equivalent resistance $R_m$ and the grounded equivalent resistance $R_g$ of the lower electrode RF circuit can also be obtained in any other methods, which are not limited in the present disclosure.

Figure 5A:
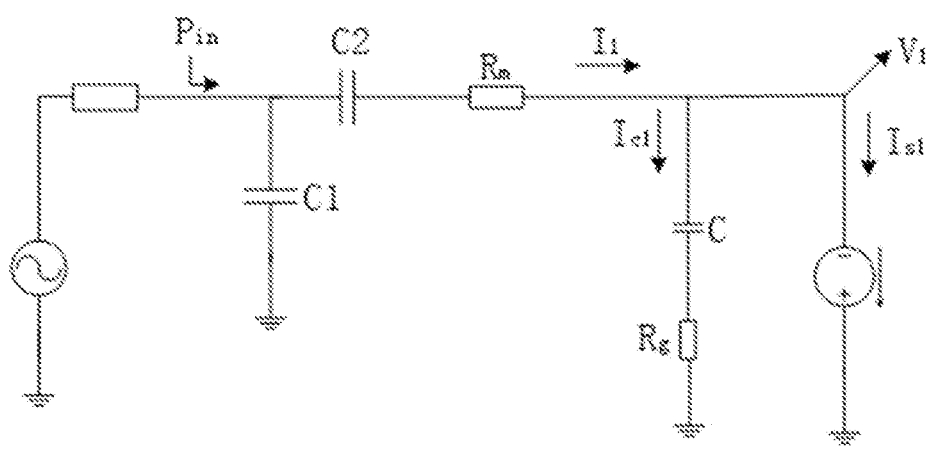
FIG. 5A illustrates a schematic equivalent diagram of the lower electrode RF circuit in FIG. 4A when performing process step Step1.

Taking the inductively coupled plasma equipment shown in FIG. 4A as an example of performing semiconductor processing 1, as shown in FIG. 5A, the equation (5) of the bias voltage value $V_1$ of the lower electrode 8 is:

$$V_1 = I_{c1}\sqrt{R_g^2 + \left(\frac{1}{\omega C}\right)^2} \quad (5)$$

where, $I_{c1}$ is the current in the lower electrode-to-ground branch corresponding to semiconductor processing 1.

The equation (6) of the current $I_1$ at the output end of the matcher in the main path of the lower electrode RF circuit corresponding to semiconductor processing 1 is:

$$I_1 = I_{c1} + I_{s1} \quad (6)$$

The above bias voltage value $V_1$ and current $I_1$ can be detected and obtained by the voltage detection unit 23 and the current detection unit 24, respectively. The grounded equivalent resistance $R_g$ can be calculated through the equation (3). Therefore, the equation (7) of the current $I_{s1}$ in the plasma sheath branch corresponding to semiconductor processing 1 is:

$$I_{s1} = I_1 - \frac{V_1}{\sqrt{R_g^2 + \left(\frac{1}{\omega C}\right)^2}} \quad (7)$$

Figure 5B:
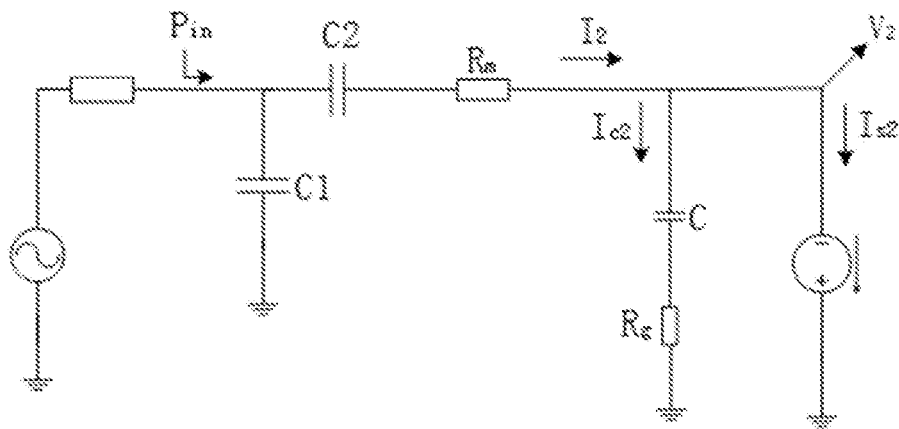
FIG. 5B illustrates a schematic equivalent diagram of the lower electrode RF circuit in FIG. 4A when performing process step Step2.

For example, semiconductor processing 2 is performed by the inductively coupled plasma equipment shown in FIG. 4A, as shown in FIG. 5B, the equation (8) of the bias voltage value $V_2$ of the lower electrode 8 is:

$$V_2 = I_{c2}\sqrt{R_g^2 + \left(\frac{1}{\omega C}\right)^2} \quad (8)$$

where, $I_{c2}$ is the current in the lower electrode-to-ground branch corresponding to semiconductor processing 2.

The equation (9) of the current $I_2$ at the output end of the matcher in the main path of the lower electrode RF circuit corresponding to semiconductor processing 2 is:

$$I_2 = I_{c2} + I_{s2} \quad (9)$$

The above bias voltage value $V_2$ and current $I_2$ can be detected by the voltage detection unit 23 and the current detection unit 24, respectively. The grounded equivalent resistance $R_g$ can be calculated through the equation (3) as above. Therefore, the equation (10) of the current $I_{s2}$ in the plasma sheath branch corresponding to semiconductor processing 2 is:

$$I_{s2} = I_2 - \frac{V_2}{\sqrt{R_g^2 + \left(\frac{1}{\omega C}\right)^2}} \quad (10)$$

From the above, the equation for the current $I_s$ in the plasma sheath branch can be applied regardless of whether semiconductor processing 1, semiconductor processing 2, or any other different processing.

Figure 6:
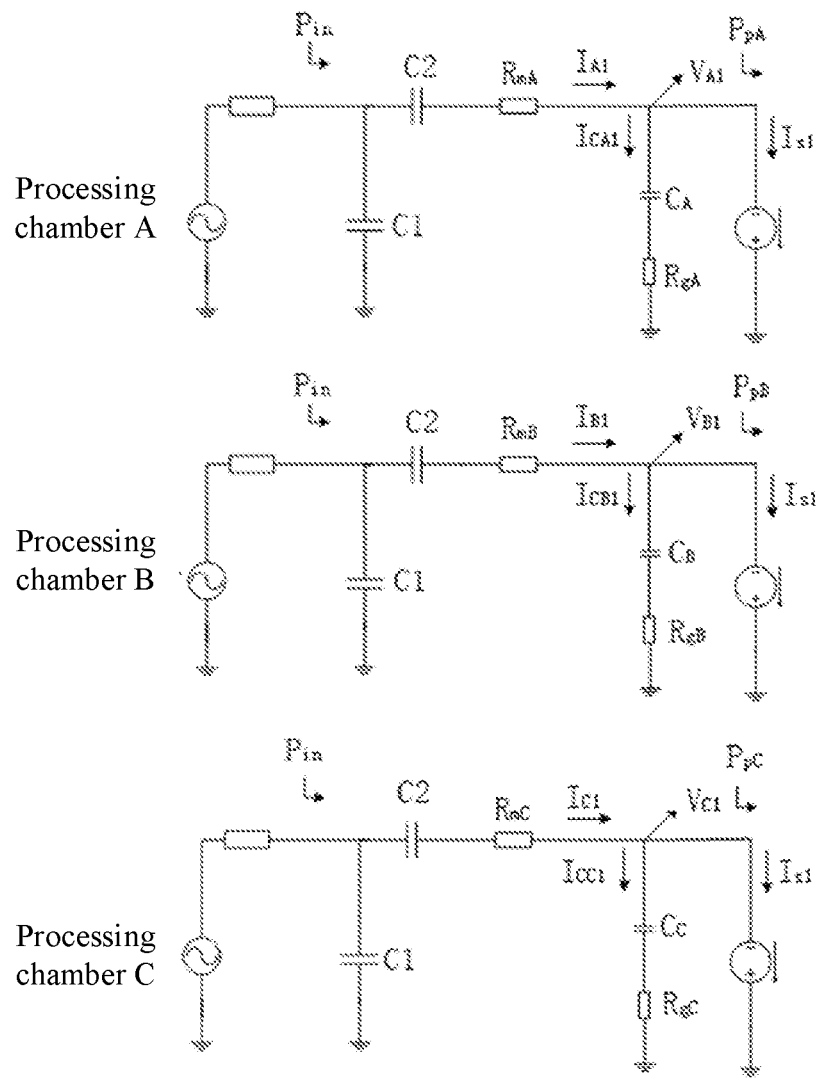
FIG. 6 illustrates schematic equivalent diagrams of lower electrode RF circuits in different processing chambers according to embodiments of the present disclosure.

Taking three process chambers (A, B, C) as an example, as shown in FIG. 6, firstly, step 201 to step 203 can be used to obtain the loss equivalent resistance $R_{mA}$ and grounded equivalent resistance $R_{gA}$ for processing chamber A, the loss equivalent resistance $R_{mB}$ and ground equivalent resistance $R_{gB}$ for processing chamber B, the loss equivalent resistance $R_{mC}$ and grounded equivalent resistance Rec for processing chamber C. Additionally, the capacitance detection unit of processing chamber A can be configured to obtain the lower electrode-to-ground capacitance $C_A$. The capacitance detection unit of processing chamber B can be configured to obtain the lower electrode-to-ground capacitance $C_B$. The capacitance detection unit of processing chamber C can be configured to obtain the lower electrode-to-ground capacitance $C_C$.

Since the loss equivalent resistances $R_m$, the grounded equivalent resistances Rg, and the lower electrode-to-ground capacitances C corresponding to different chambers are different, the bias voltage values corresponding to different chambers can be different. That is, for example, semiconductor processing 1 is performed, $V_{A1} \neq V_{B1} \neq V_{C1}$. Based on this, when the power setting value of the lower electrode power supply 4 of the three processing chambers (A, B, and C) is $P_{in}$, remaining power $P_{pA}$, remaining power $P_{pB}$, and remaining power $P_{pC}$ utilized by the plasma 9 corresponding to the three processing chambers (A, B, and C) can have the following equations.

$$P_{pA} = V_{A1}I_{s1} = \eta_{A1}P_{in} \quad (11)$$

$$P_{pB} = V_{B1}I_{s1} = \eta_{B1}P_{in} \quad (12)$$

$$P_{pC} = V_{C1}I_{s1} = \eta_{C1}P_{in} \quad (13)$$

where, $\eta_{A1}$, $\eta_{B1}$, and $\eta_{C1}$ are power transmission efficiencies for the three processing chambers (A, B, and C) respectively. $I_{s1}$ can be the current in the plasma sheath branch corresponding to semiconductor processing 1.

If processing chamber A is selected as the reference chamber, the equation (7) can be used to calculate the current $I_{s1}$ for processing chamber A. The currents in the plasma sheath branches corresponding to semiconductor processing 1 for the other two processing chambers (B and C) can be set to be equal to $I_{s1}$.

When semiconductor processing 1 is performed in processing chamber B, the power compensation coefficient of processing chamber B can be set to $\beta_{B1}$. If the remaining power $P_{pB}$ utilized by the plasma 9 corresponding to processing chamber B is equal to the remaining power $P_{pC}$ utilized by the plasma 9 corresponding to processing chamber C, the following equation exists.

$$\eta_{B1}(\beta_{B1}P_{in}) = V_{B1}I_{s1}\beta_{B1} = V_{A1}I_{s1} = \eta_{A1}P_{in} \tag{14}$$

According to the equation (14) above, the equation for the power compensation coefficient $\beta_{B1}$ for processing chamber B is derived as:

$$\beta_{B1} = \frac{V_{A1}I_{s1}}{V_{B1}I_{s1}} \tag{15}$$

Assuming that an RF frequency applied to the lower electrode 8 is f, an impedance corresponding to the ground capacitance $C_A$ of processing chamber A is X, and $$X = \frac{1}{\omega C_A},$$

$$\beta_{B1} = \frac{V_{A1}I_{s1}}{V_{B1}I_{s1}} = \frac{I_{cA1}XI_{s1}}{I_{cB1}YI_{s1}} = \tag{22}$$

$$\frac{2(R_{mB}+R_{gB})(I_{A1}-I_{s1})X}{[-I_{s1}(2R_{mB}+Y)]Y + Y\sqrt{I_{s1}^2(2R_{mB}+Y)^2 - 4(R_{mB}+R_{gB})[I_{s1}^2(R_{mB}-R_{mA}) - (I_{A1}-I_{s1})^2(R_{mA}+R_{gA}) - (2I_{s1}R_{mA}+X)(I_{A1}-I_{s1})]}}$$

where $\omega=2\pi f$, an impedance corresponding to the ground capacitance $C_B$ of processing chamber B is Y, and $$Y = \frac{1}{\omega C_B},$$

where $\omega=2\pi f$. Based on this, the bias voltage values corresponding to processing chamber A and processing chamber B under the same power setting value $P_{in}$, respectively, are:

$$V_{A1} = I_{cA1}\sqrt{R_{gA}^2 + \left(\frac{1}{\omega C_A}\right)^2} = I_{cA1}\sqrt{R_{gA}^2 + X^2} \tag{16}$$

$$V_{B1} = I_{cB1}\sqrt{R_{gB}^2 + \left(\frac{1}{\omega C_B}\right)^2} = I_{cB1}\sqrt{R_{gB}^2 + Y^2} \tag{17}$$

Moreover, the currents at output ends of the matchers in the main paths of the lower RF circuits corresponding to processing chamber A and processing chamber B with the same power setting value $P_{in}$, respectively, are:

$$I_{A1} = I_{cA1} + I_{s1} \tag{18}$$

$$I_{B1} = I_{cB1} + I_{s1} \tag{19}$$

Then, the power setting value $P_{in}$ is:

$$P_{in} = I_{A1}^2 R_{mA} + I_{cA1}^2 R_{gA} + V_{A1}I_{s1} = I_{B1}^2 R_{mB} + I_{cB1}^2 R_{gB} + V_{B1}I_{s1} \tag{20}$$

According to the above equations (16) to (20), the current $I_{cB1}$ in the lower electrode-to-ground branch corresponding to processing chamber B is derived as:

$$I_{cB1} = \frac{-I_{s1}(2R_{mB}+Y) + \sqrt{I_{s1}^2(2R_{mB}+Y)^2 - 4(R_{mB}+R_{gB})[I_{s1}^2(R_{mB}-R_{mA}) - I_{cA1}^2(R_{mA}+R_{gA}) - 2I_{s1}I_{cA1}R_{mA} - I_{s1}I_{cA1}X]}}{2(R_{mB}+R_{gB})} \tag{21}$$

Using processing chamber A as the reference chamber, and substituting the above equation (21) into the equation (15), the power compensation equation for processing chamber B corresponding to semiconductor processing 1 is derived as:

Where, $\beta_{B1}$ is the power compensation coefficient for processing chamber B corresponding to semiconductor processing 1 relative to processing chamber A.

The first RF circuit parameter set of processing chamber A can include $I_A$, $I_S$, $R_{mA}$, $R_{gA}$, and X. $I_{A1}$ is the current at the output end of the matcher in the main path of the lower electrode RF circuit corresponding to semiconductor processing 1. $I_{s1}$ is the current in the plasma sheath circuit branch of the lower electrode RF circuit corresponding to semiconductor processing 1. $R_{mA}$ is the loss equivalent resistance of the lower electrode RF circuit of processing chamber A. $R_{gA}$ is the grounded equivalent resistance of the lower electrode RF circuit of processing chamber A. X is the impedance value corresponding to the lower electrode-to-ground capacitance of processing chamber A, and $$X = \frac{1}{\omega C_A},$$

where $\omega$ is the angular frequency. $C_A$ is the lower electrode-to-ground capacitance of processing chamber A.

The second RF circuit parameter set of processing chamber B can include $R_{mB}$, $R_{gB}$, and Y. $R_{mB}$ is the loss equivalent resistance of the lower electrode RF circuit of processing chamber B. $R_{gB}$ is the grounded equivalent resistance of the lower electrode RF circuit of processing chamber B. Y is the impedance value corresponding to the lower electrode-to-ground capacitance of processing chamber B, and $$Y = \frac{1}{\omega C_B},$$

where $\omega$ is the angular frequency. $C_B$ is the lower electrode-to-ground capacitance of processing chamber B.

Similarly, using processing chamber A as the reference chamber, the power compensation equation for processing chamber C corresponding to semiconductor processing 1 is derived as:

$$\beta_{C1} = \frac{V_{A1}I_{s1}}{V_{C1}I_{s1}} = \frac{I_{CA1}XI_{s1}}{I_{CC1}ZI_{s1}} = \frac{2(R_{mC}+R_{gC})(I_{A1}-I_{s1})X}{[-I_{s1}(2R_{mC}+Z)]Z + Z\sqrt{I_{s1}^2(2R_{mC}+Z)^2 - 4(R_{mC}+R_{gC})\left[I_{s1}^2(R_{mC}-R_{mA})-(I_{A1}-I_{s1})^2(R_{mA}+R_{gA})-(2I_{s1}R_{mA}+X)(I_{A1}-I_{s1})\right]}} \quad (23)$$

Where $\beta_{C1}$ is the power compensation coefficient for processing chamber C corresponding to semiconductor processing 1 relative to processing chamber A.

The second RF circuit parameter set of processing chamber C can include $R_{mC}$, $R_{gC}$, and Z. $R_{mC}$ is the loss equivalent resistance of the lower electrode RF circuit of processing chamber C. $R_{gC}$ is the grounded equivalent resistance of the lower electrode RF circuit of processing chamber C. Z is the impedance value corresponding to the lower electrode-to-ground capacitance of processing chamber C, and $$Z = \frac{1}{\omega C_C},$$

where $\omega$ is the angular frequency. $C_C$ is the lower electrode-to-ground capacitance of processing chamber C.

Similarly, using processing chamber A as the reference chamber, the power compensation equations for processing chamber B and processing chamber C corresponding to semiconductor processing 2 are derived as:

$$\beta_{B2} = \frac{V_{A2}I_{s2}}{V_{B2}I_{s2}} = \frac{I_{CA2}XI_{s2}}{I_{CB2}YI_{s2}} = \frac{2(R_{mB}+R_{gB})(I_{A2}-I_{s2})X}{[-I_{s2}(2R_{mB}+Y)]Y + Y\sqrt{I_{s2}^2(2R_{mB}+Y)^2 - 4(R_{mB}+R_{gB})\left[I_{s2}^2(R_{mB}-R_{mA})-(I_{A2}-I_{s2})^2(R_{mA}+R_{gA})-(2I_{s2}R_{mA}+X)(I_{A2}-I_{s2})\right]}} \quad (24)$$

$$\beta_{C2} = \frac{V_{A2}I_{s2}}{V_{C2}I_{s2}} = \frac{I_{CA2}XI_{s2}}{I_{CC2}ZI_{s2}} = \frac{2(R_{mC}+R_{gC})(I_{A2}-I_{s2})X}{[-I_{s2}(2R_{mC}+Z)]Z + Z\sqrt{I_{s2}^2(2R_{mC}+Z)^2 - 4(R_{mC}+R_{gC})\left[I_{s2}^2(R_{mC}-R_{mA})-(I_{A2}-I_{s2})^2(R_{mA}+R_{gA})-(2I_{s2}R_{mA}+X)(I_{A2}-I_{s2})\right]}} \quad (25)$$

It should be noted that the semiconductor processing 1 and semiconductor processing 2 above can include two different processing recipes or two different processing steps within the same semiconductor processing.

In some optional embodiments, the semiconductor processing can include a plurality of processing steps. For different processing steps, the current $I_{s1}$ in the plasma sheath branch of the lower RF circuit can be different. Thus, taking processing chamber A as the reference chamber as an example, the power control method of embodiments of the present disclosure further includes the following steps.

At 301, before performing the semiconductor processing, pre-obtained $I_A$ (the current at the output end of the lower matcher 3 in the main path of the lower RF circuit) and $I_S$ (the current in the plasma sheath branch) corresponding to the processing steps are written in a parameter table. For example, the processing steps include N steps, and N is an integer greater than 1.

The $I_A$ and $I_S$ corresponding to the processing steps can be calculated using the equation (7) above.

Table 1 shows the parameter table of $I_A$ and $I_S$ of processing chamber A (i.e., the reference chamber) corresponding to the N processing steps.

| Step | $I_s$ | $I_A$ |
|---|---|---|
| 1 | $I_{s1}$ | $I_{A1}$ |
| 2 | $I_{s2}$ | $I_{A2}$ |
| ... | ... | ... |
| N | $I_{sN}$ | $I_{AN}$ |

At 302, the pre-obtained $R_{mA}$, $R_{gA}$, and $C_A$ corresponding to processing chamber A and $R_{mB}$, $R_{gB}$, and $C_B$ corresponding to processing chamber B are called.

Then, step 101 is performed. Step 101 can include:
when processing chamber B begins an i-th processing step (i=1, 2, ..., N), calling $I_{Ai}$ and $I_{Si}$ corresponding to the i-th processing step from the parameter table; and
by using the power compensation equation (22) and according to $I_{Ai}$, $I_{Si}$, $R_{mA}$, $R_{gA}$, $C_A$, $R_{mB}$, $R_{gB}$, and $C_B$ corresponding to the i-th processing step, obtaining the power compensation coefficient $\beta_{Bi}$ of processing chamber B corresponding to the i-th processing step.

Figure 7:
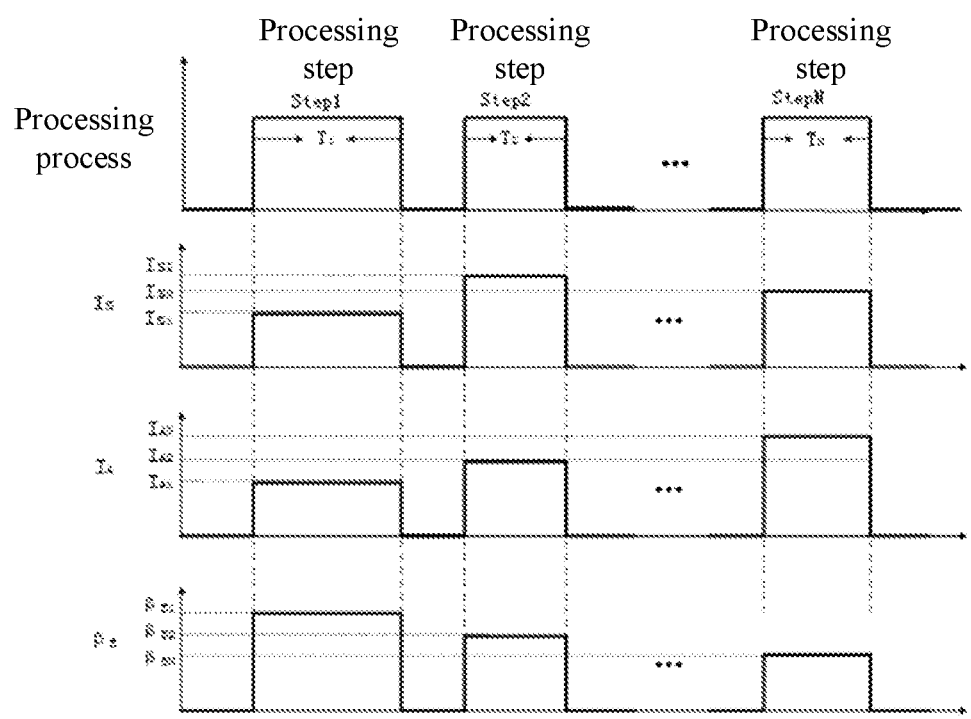
FIG. 7 illustrates a schematic diagram showing power compensation coefficients corresponding to different processing steps according to embodiments of the present disclosure.

As shown in FIG. 7, in a process of performing N processing steps (Step1, Step2, ..., StepN), each processing step corresponds to an $I_s$, an $I_A$, and a power compensation coefficient.

It should be noted that the method for obtaining the power compensation coefficient $\beta_{Bi}$ corresponding to the i-th processing step is illustrated here only with processing chamber B as an example. In practical applications, the other chambers with the same structure except the reference chamber can be suitable for the method for obtaining the power compensation coefficient $\beta_i$ corresponding to the i-th processing step.

At 102, the power compensation value of the present processing chamber relative to the reference chamber is calculated according to the power compensation coefficient and the power setting value of the lower RF power supply of the present processing chamber.

In some optional embodiments, step 102 can specifically include:
calculating the product of the power compensation coefficient and the power setting value as the power compensation value.

At 103, the lower RF power supply 4 is controlled to output the power compensation value.

In step 103, the power output by the lower RF power supply 4 can be the compensated power value.

Figure 8:
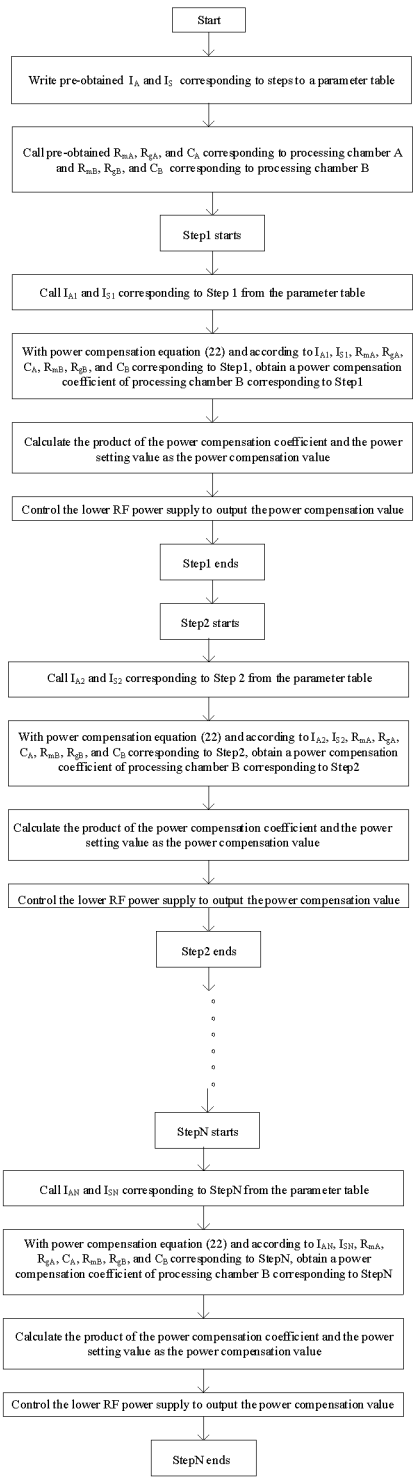
FIG. 8 illustrates a schematic block diagram of a power control method of a lower electrode RF power supply in the semiconductor processing equipment according to some embodiments of the present disclosure.

For the plurality of processing steps, each time step 103 is performed until the current processing step ends, and a next processing step is performed, $I_A$ and $I_S$ corresponding to the next processing step can be called from the parameter table, and the power compensation coefficient corresponding to the next processing step can be calculated again. For the specific execution processes, reference can be made to FIG. 8.

Step 102 and step 103 are used to calculate the power compensation value and perform power compensation on the power setting value (i.e., $P_{in}$) output by the lower RF power supply 4. Thus, the remaining power $P_p$ utilized by the plasma 9 of the other chambers with the same structure except the reference chamber can be consistent with the remaining power $P_p$ of the reference chamber to ensure that the RF bias voltages of different chambers are consistent to achieve consistent processing results.

Figure 9:
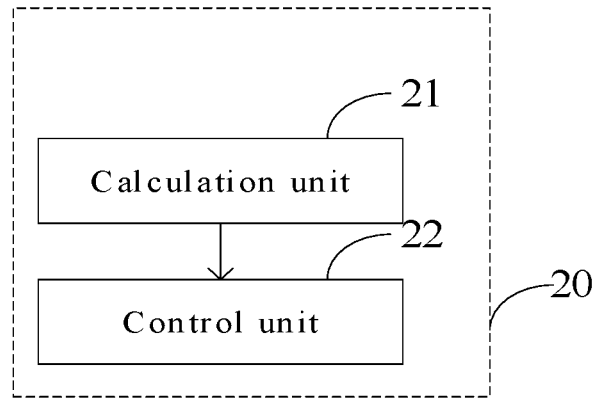
FIG. 9 illustrates a schematic block diagram showing a principle of a power control device of the lower electrode RF power supply in the semiconductor processing equipment according to some embodiments of the present disclosure.

As another technical solution, as shown in FIG. 9, embodiments of the present disclosure also provide a power control device 20 of the lower RF power supply in the semiconductor processing equipment, which includes a calculation unit 21 and a control unit 22. The calculation unit 21 can be configured to, when the semiconductor processing begins in the processing chamber, obtain the power compensation coefficient of the present processing chamber relative to the reference chamber by using the predetermined power compensation equation and according to the pre-obtained first RF circuit parameter set of the reference chamber and the second RF circuit parameter set of the present processing chamber that performs the semiconductor processing, and calculate the power compensation value of the present processing chamber relative to the reference chamber according to the power compensation coefficient and the power setting value of the lower RF power supply of the present processing chamber.

The control unit 22 can be configured to control the lower RF power supply to output the power compensation value.

The reference chamber can be a determined chamber from the plurality of processing chambers with the same structure. The first RF circuit parameter set of the reference chamber can be a combination of the feature parameters of the lower electrode of the reference chamber. The first RF circuit parameter set can include but is not limited to the current at the output end of the lower matcher in the main path of the lower electrode RF circuit, the current of the plasma sheath branch of the lower electrode RF circuit, the loss equivalent resistance and the grounded equivalent resistance of the lower electrode RF circuit, and the lower electrode-to-ground capacitance.

The present processing chamber can be processing chambers with the same structure except the reference chamber. The second RF circuit parameter set of the present processing chamber can include but is not limited to the loss equivalent resistance and the grounded equivalent resistance of the lower RF circuit and the lower electrode-to-ground capacitance.

Taking the inductively coupled plasma equipment shown in FIG. 4A as an example, as shown in FIG. 2B, capacitor C1 and capacitor C2 are both variable capacitors in the lower matcher 3. The loss resistance of the lower matcher 3 and the contact resistance of the lower electrode RF circuit as a whole can be considered as the loss equivalent resistance $R_m$ of the lower electrode RF circuit. The loss equivalent resistance $R_m$ can be connected in series in the main path of the lower electrode RF circuit. The equivalent circuit part connected to the output end of the main path can include two parallel branches. One of the branches can be a lower electrode-to-ground branch. The lower electrode-to-ground branch can include a lower electrode-to-ground capacitance C and an equivalent resistance $R_g$ when the lower electrode is grounded. The other branch can be a plasma sheath branch. The plasma sheath branch can include an impedance real part $R_p$ and an equivalent inductance $L_p$ of an impedance imaginary part of the plasma 9, and an impedance real part $R_s$ and an equivalent capacitance $C_s$ of an impedance imaginary part of the plasma sheath. Additionally, the current in the lower electrode-to-ground branch can be $I_c$, the current in the plasma sheath branch can be $I_s$, and the current at the output end of the lower matcher 3 in the main path of the lower electrode RF circuit can be I.

It should be noted that whether for the reference chamber or other process chambers, the inherent parameters such as the loss equivalent resistance $R_m$, the grounded equivalent resistance $R_g$, and the lower electrode-to-ground capacitance C can remain unchanged when performing the processing. The plasma sheath parameter of the lower electrode RF circuit (e.g., the RF bias voltage and the current in the plasma sheath branch) can change with different processing processes. The current $I_c$ in the lower electrode-to-ground branch is made of most of the current I (usually greater than 10 amperes). However, the current $I_s$ in the plasma sheath branch can be small (smaller than 1 ampere). Thus, the current $I_s$ in the plasma sheath branch can be regarded as a constant current. Since the remaining power $P_p$ utilized by the plasma 9 (also referred to as absorption power) is a product of the RF bias voltage and the current $I_s$ in the plasma sheath branch, the remaining power $P_p$ can also change with the processing. Based on this, the lower electrode loss feature of different chambers can be reflected by the inherent parameters and the plasma sheath parameters. The difference in the remaining power $P_p$ between the other processing chambers and the reference chamber can be compensated according to the lower electrode loss feature to allow different chambers to have the same remaining power $P_p$. Thus, the RF bias voltages of different chambers can be ensured to be consistent, and the processing results can be consistent.

In some optional embodiments, the above power compensation equation is:

$$\beta_B = \frac{2(R_{mB} + R_{gB})(I_A - I_S)X}{[-I_S(2R_{mB} + Y)]Y + Y\sqrt{I_S^2(2R_{mB} + Y)^2 - 4(R_{mB} + R_{gB})[I_S^2(R_{mB} - R_{mA}) - (I_A - I_S)^2(R_{mA} + R_{gA}) - (2I_S R_{mA} + X)(I_A - I_S)]}}$$

Where $\beta_B$ is the power compensation coefficient of the present processing chamber (taking the processing chamber B in FIG. 6 as an example) relative to the reference chamber. The first RF circuit parameter set can include $I_A$, $I_S$, $R_{mA}$, $R_{gA}$, and X, where $I_A$ is the current at the output end of the matcher in the main path of the lower electrode RF circuit. $I_S$ is the current in the plasma sheath branch of the lower electrode RF circuit of the reference chamber. $R_{mA}$ is the loss equivalent resistance of the lower electrode RF circuit of the reference chamber; $R_{gA}$ is the grounded equivalent resistance of the lower electrode RF circuit of the reference chamber. X is the impedance value corresponding to the lower electrode-to-ground capacitance of the reference chamber, and $$X = \frac{1}{\omega C_A},$$

where $\omega$ is the angular frequency. $C_A$ of the lower electrode-to-ground capacitance of the reference chamber.

The second RF circuit parameter set can include $R_{mB}$, $R_{gB}$, and Y. $R_{mB}$ is the loss equivalent resistance of the lower electrode RF circuit of the present processing chamber. $R_{gB}$ is the grounded equivalent resistance of the lower electrode RF circuit of the present processing chamber. Y is the impedance value corresponding to the lower electrode-to-ground capacitance of the present processing chamber.

$$Y = \frac{1}{\omega C_B},$$

where $\omega$ is the angular frequency. $C_B$ of the lower electrode-to-ground capacitance of the present processing chamber.

In some optional embodiments, taking the inductively coupled plasma equipment shown in FIG. 4A as an example, the control unit 22 is also configured to activate the lower RF power supply 4 of the processing chamber and apply the determined power value to the lower electrode 8 through the matcher 3 to ensure that the plasma in the processing chamber does not ignite.

Specifically, as shown in FIG. 4B, corresponding to each processing chamber (including the reference chamber and the processing chamber), the lower RF power supply 4 of the processing chamber is activated (the upper RF power supply 1 is turned off). The determined power value $P_{low}$ is applied to the lower electrode 8 through matcher 3.

The determined power value $P_{low}$ can be low compared to the power value adopted by normal processing. Thus, when the determined power value $P_{low}$ is applied to the lower electrode, when the lower matcher 3 is paired, the determined power value $P_{low}$ can be consumed by the lower electrode-to-ground branch. Since the RF power supply 1 is turned off, and the determined power value $P_{low}$ is low, the power may not be sufficient to cause the plasma in the processing chamber to ignite. Thus, the plasma load cannot be generated.

Figure 10:
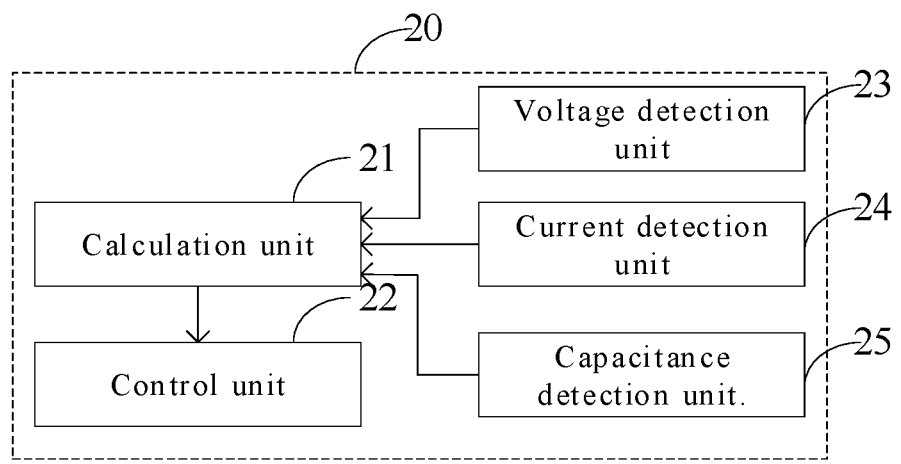
FIG. 10 illustrates a schematic block diagram showing another principle of a power control device of the lower electrode RF power supply in the semiconductor processing equipment according to some embodiments of the present disclosure.

Based on this, as shown in FIG. 10, the power control device 20 further includes a current detection unit 24, a voltage detection unit 23, and a capacitance detection unit 25. The current detection unit 24 is arranged in the circuit between the output end of the matcher 3 and the lower electrode 8 and configured to detect the present current (i.e., $I_0$) at the output end side of the lower matcher 3 in the main path of the lower electrode RF circuit. The voltage detection unit, for example, can be electrically connected to the RF electrode of the lower electrode 8 and configured to detect the present bias voltage value of the lower electrode 8 (i.e., $V_0$). The capacitance detection unit can be configured to detect the lower electrode-to-ground capacitance (i.e., C) of the lower electrode 8.

Based on this, the calculation unit 21 can be further configured to calculate the loss equivalent resistance $R_m$ and the grounded equivalent resistance $R_g$ of the lower electrode RF circuit using the following equation and the present current $I_0$, the present bias voltage value $V_0$, and the lower electrode-to-ground capacitance C. The equations are as follows.

$$R_g = \sqrt{\left(\frac{V_0}{I_0}\right)^2 - \left(\frac{1}{\omega C}\right)^2}$$

$$R_m = \frac{P_{low}}{I_0^2} - R_g$$

where, $R_g$ is the grounded equivalent resistance of the lower electrode RF circuit, $R_m$ is the loss equivalent resistance of the lower electrode RF circuit, $V_0$ is the present bias voltage value, $I_0$ is the present current, $\omega$ is the angular frequency, C is the lower electrode-to-ground capacitance, and $P_{low}$ is the determined power value.

In some optional embodiments, the semiconductor processing can include a plurality of processing steps. The power control device 20 can further include a writing unit. The writing unit can be configured to write the pre-obtained $I_A$ (the current at the output end side of the lower matcher 3 in the main path of the lower electrode RF circuit) and $I_S$ (the current in the plasma sheath branch) into the parameter table.

Optionally, $I_A$ and $I_s$ corresponding to the processing steps (Step) can be calculated through the equation (7) of the above embodiments.

Based on this, taking processing chamber A as the reference chamber and processing chamber B as the chamber that is performing the processing as an example, the calculation unit 21 can be further configured to call $R_{mA}$, $R_{gA}$, $C_A$, $R_{mB}$, $R_{gB}$, and $C_B$. When processing chamber B starts to perform the i-th processing step (i=1, 2, . . . , N), $I_{Ai}$ and $I_{Si}$ corresponding to the i-th processing step can be called from the above parameter table. With the above power compensation equation, and according to $I_{Ai}$, $I_{Si}$, $R_{mA}$, $R_{gA}$, $C_A$, $R_{mB}$, $R_{gB}$, and $C_B$ corresponding to the i-th processing step, the power compensation coefficient $\beta_{Bi}$ of processing chamber B corresponding to the i-th processing step.

In some optional embodiments, the calculation unit 21 can be configured to calculate the product of the power compensation coefficient and the power setting value as the power compensation value.

In the technical solution of the power control method and device of the lower RF power supply in the semiconductor processing equipment of embodiments of the present disclosure, when the processing chamber starts the semiconductor processing, with the pre-determined power compensation equation and according to the pre-obtained first RF circuit parameter set and the second RF circuit parameter set of the present processing chamber performing the semiconductor processing, the power compensation coefficient can be obtained. According to the power compensation coefficient and the power setting value of the lower RF power supply of the present processing chamber, the power compensation value can be calculated. Then, the lower RF power supply can be controlled to output the power compensation value. Thus, the difference in the power utilized by the plasma between the other processing chambers except for the reference chamber and the reference chamber can be compensated. Thus, the consistency in the bias voltage values generated on the wafers between different chambers under the same processing recipe can be improved. Thus, the processing result consistency of the different processing chambers can be improved.

As another technical solution, embodiments of the present disclosure further provide semiconductor processing equipment. Taking the inductively coupled plasma equipment shown in FIG. A as an example, the equipment includes processing chamber 11. A dielectric window 6 is arranged at the top of processing chamber 11. An inductive coupling coil 5 is arranged above the dielectric window 6. The inductive coupling coil 5 can be electrically connected to the upper RF power supply 1 through the upper matcher 2. The upper RF power supply 1 can apply the RF power to the inductive coupling coil 5 through the upper matcher 2 to excite the process gas in the processing chamber 11 to generate the plasma 9. Moreover, the lower electrode 8 (e.g., the electrostatic chuck) can be arranged in the processing chamber 11 and configured to carry the wafer 7. The lower electrode 8 can be electrically connected to the lower RF power supply 4 through the lower matcher 3. The lower RF power supply 4 can be configured to apply the RF power to the lower electrode 8 to generate the RF bias voltage on the wafer surface to accelerate the ions to etch the wafer.

The semiconductor processing equipment of embodiments of the present disclosure can adopt the power control device of embodiments of the present disclosure. With the device, the consistency in the bias voltage values generated on the wafers of different chambers under the same processing recipe can be improved. Thus, the processing result consistency of the different processing chambers can be improved.

It can be noted that the above embodiments are merely exemplary embodiments used to illustrate the principle of the present disclosure. However, the present disclosure is not limited to this. For those skilled in the art, without departing from the spirit and essence of the present disclosure, various variations and improvements can be made. These variations and improvements are also within the scope of the present disclosure.

What is claimed is:

1. A power control method of a lower RF power supply of semiconductor processing equipment comprising:

when a processing chamber starts semiconductor processing, with a predetermined power compensation equation and according to a pre-obtained first RF circuit parameter set of a reference chamber and a second RF circuit parameter set of a present processing chamber performing the semiconductor processing, obtaining a power compensation coefficient of the present processing chamber relative to the reference chamber;

according to the power compensation coefficient and a power setting value of the lower RF power supply of the present processing chamber, calculating a power compensation value of the present processing chamber relative to the reference chamber; and controlling the lower RF power supply to output the power compensation value;

wherein:

the first RF circuit parameter set includes a current at an output end of a lower matcher in a main path of a lower electrode RF circuit of the reference chamber, a current in a plasma sheath branch of the lower electrode RF circuit of the reference chamber, a loss equivalent resistance and a ground equivalent resistance of the lower electrode RF circuit of the reference chamber, and a lower electrode-to-ground capacitance of the reference chamber; and the second RF circuit parameter set includes a loss equivalent resistance and aa grounded equivalent resistance of the lower RF circuit of the present processing chamber and a lower electrode-to-ground capacitance of the present processing chamber.

2. The power control method according to claim 1, wherein a power compensation equation is:

$$\beta_B = \frac{2(R_{mB} + R_{gB})(I_A - I_S)X}{[-I_S(2R_{mB} + Y)]Y + Y\sqrt{I_S^2(2R_{mB} + Y)^2 - 4(R_{mB} + R_{gB})\left[I_S^2(R_{mB} - R_{mA}) - (I_A - I_S)^2(R_{mA} + R_{gA}) - (2I_S R_{mA} + X)(I_A - I_S)\right]}}$$

wherein:
  $\beta_B$ is the power compensation coefficient of the present processing chamber relative to the reference chamber;
  the first RF circuit parameter set includes $I_A$, $I_S$, $R_{mA}$, $R_{gA}$, and X;
  $I_A$ is a current at an output end of a matcher in a main path of a lower electrode RF circuit of the reference chamber;
  $I_S$ is a current in a plasma sheath branch of the lower electrode RF circuit of the reference chamber;
  $R_{mA}$ is a loss equivalent resistance of the lower electrode RF circuit of the reference chamber;
  $R_{gA}$ is a grounded equivalent resistance of the lower electrode RF circuit of the reference chamber;
  X is an impedance value corresponding to a lower electrode-to-ground capacitance of the reference chamber, and $$X = \frac{1}{\omega C_A},$$

$\omega$ being an angular frequency, $C_A$ being the lower electrode-to-ground capacitance of the reference chamber;
  the second RF circuit parameter set includes $R_{mB}$, $R_{gB}$, and Y;
  $R_{mB}$ is a loss equivalent resistance of a lower electrode RF circuit of the present processing chamber;
  $R_{gB}$ is a grounded equivalent resistance of the lower electrode RF circuit of the present processing chamber;
  Y is an impedance value corresponding to a lower electrode-to-ground capacitance of the present processing chamber, and $$Y = \frac{1}{\omega C_B},$$

$\omega$ being the angular frequency, and $C_B$ being a lower electrode-to-ground capacitance of the present processing chamber.

3. The power control method according to claim 2, wherein acquisition methods of the loss equivalent resistance and the grounded equivalent resistance of the lower electrode RF circuit for each processing chamber include:
  turning on the lower RF power supply of the processing chamber to apply a determined power value to the lower electrode through the matcher to ensure that plasma in the processing chamber does not ignite;
  detecting a present current at an output end side of the matcher in a main path in the lower electrode RF circuit, a present bias voltage value of the lower electrode, and a lower electrode-to-ground capacitance; and
  using following equations to calculate the loss equivalent resistance and the grounded equivalent resistance of the lower electrode RF circuit according to the present current, the present bias voltage value, and the lower electrode-to-ground capacitance:

$$R_g = \sqrt{\left(\frac{V_0}{I_0}\right)^2 - \left(\frac{1}{\omega C}\right)^2} \text{ and } R_m = \frac{P_{low}}{I_0^2} - R_g;$$

wherein:
  $R_g$ is the grounded equivalent resistance of the lower electrode RF circuit;
  $R_m$ is the loss equivalent resistance of the lower electrode RF circuit;
  $V_0$ is the present bias voltage value;
  $I_0$ is the present current;
  $\omega$ is the angular frequency;
  C is the lower electrode-to-ground capacitance; and
  $P_{low}$ is the determined power value.

4. The power control method according to claim 2, wherein the semiconductor processing includes a plurality of processing steps;
the power control method further comprising:
  before performing the semiconductor processing, writing pre-obtained $I_A$ and $I_S$ corresponding to the processing steps into a parameter table;
  calling $R_{mA}$, $R_{gA}$, $C_A$, $R_{mB}$, $R_{gB}$, and $C_B$; and
  when the processing chamber starts performing the semiconductor processing, with the predetermined power compensation equation and according to the pre-obtained first RF circuit parameter set of the reference chamber and the second RF circuit parameter set of the present processing chamber performing the semiconductor processing, obtaining the power compensation coefficient of the present processing chamber relative to the reference chamber, including:
    when the present processing chamber starts performing the processing steps, calling $I_A$ and $I_S$ corresponding to a current processing step from the parameter table; and
    with the power compensation equation and according to $I_A$, $I_S$, $R_{mA}$, $R_{gA}$, $C_A$, $R_{mB}$, $R_{gB}$, and $C_B$, obtaining the power compensation coefficient.

5. The power control method according to claim 1, wherein according to the power compensation coefficient and the power setting value of the lower RF power supply of the present processing chamber, obtaining the power compensation value of the present processing chamber relative to the reference chamber includes:
  calculating a product of the power compensation coefficient and the power setting value as the power compensation value.

6. A power control device of a lower RF power supply in semiconductor process equipment comprising a calculation unit and a control unit, wherein:
the calculation unit is configured to, when a processing chamber starts semiconductor processing, adopt a predetermined power compensation equation, a pre-obtained first RF circuit parameter set of a reference chamber, and a second RF circuit parameter set of a present processing chamber performing the semiconductor processing, obtain a power compensation coefficient of the present processing chamber relative to the reference chamber, and according to the power compensation coefficient and a power setting value of the lower RF power supply of the present processing chamber, and calculate a power compensation value of the present processing chamber relative to the reference chamber; and
the control unit is configured to control the lower RF power supply to output the power compensation value;
wherein:
the first RF circuit parameter set includes a current at an output end of a lower matcher in a main path of a lower electrode RF circuit of the reference chamber, a current in a plasma sheath branch of the lower electrode RF circuit of the reference chamber, a loss equivalent resistance and a ground equivalent resistance of the lower electrode RF circuit of the reference chamber, and a lower electrode-to-ground capacitance of the reference chamber; and
the second RF circuit parameter set includes a loss equivalent resistance and aa grounded equivalent resistance of the lower RF circuit of the present processing chamber and a lower electrode-to-ground capacitance of the present processing chamber.

7. The power control device according to claim 6, wherein the power compensation equation is:

$$\beta_B = \frac{2(R_{mB} + R_{gB})(I_A - I_S)X}{[-I_S(2R_{mB} + Y)]Y + Y\sqrt{I_S^2(2R_{mB} + Y)^2 - 4(R_{mB} + R_{gB})[I_S^2(R_{mB} - R_{mA}) - (I_A - I_S)^2(R_{mA} + R_{gA}) - (2I_SR_{mA} + X)(I_A - I_S)]}}$$

wherein:
$\beta_B$ is the power compensation coefficient of the present processing chamber relative to the reference chamber;
the first RF circuit parameter set includes $I_A$, $I_S$, $R_{mA}$, $R_{gA}$, and X;
$I_A$ is a current at an output end of a matcher in a main path of a lower electrode RF circuit;
$I_S$ is a current in a plasma sheath branch of the lower electrode RF circuit of the reference chamber;
$R_{mA}$ is a loss equivalent resistance of the lower electrode RF circuit of the reference chamber;
$R_{gA}$ is a grounded equivalent resistance of the lower electrode RF circuit of the reference chamber;
X is an impedance value corresponding to a lower electrode-to-ground capacitance of the reference chamber, and $$X = \frac{1}{\omega C_A},$$

ω being an angular frequency, $C_A$ being the lower electrode-to-ground capacitance of the reference chamber;

the second RF circuit parameter set includes $R_{mB}$, $R_{gB}$, and Y;
$R_{mB}$ is a loss equivalent resistance of a lower electrode RF circuit of the present processing chamber;
$R_{gB}$ is a grounded equivalent resistance of the lower electrode RF circuit of the present processing chamber;
Y is an impedance value corresponding to a lower electrode-to-ground capacitance of the present processing chamber, and $$Y = \frac{1}{\omega C_B},$$

ω being the angular frequency, and $C_B$ being a lower electrode-to-ground capacitance of the present processing chamber.

8. The power control device according to claim 6, wherein the control unit is further configured to turn on the lower RF power supply of the processing chamber to apply a determined power value to the lower electrode through the matcher to ensure that a plasma in the processing chamber does not ignite;
the power control device further comprising:
a current detection unit configured to detect a present current at an output end of the matcher in a main path in the lower electrode RF circuit, and a present bias voltage value of the lower electrode;
a voltage detection unit configured to detect the present bias voltage value of the lower electrode;
a capacitance detection unit configured to detect a lower electrode-to-ground capacitance; and
the calculation unit further configured to use following equations to calculate the loss equivalent resistance and the grounded equivalent resistance of the lower electrode RF circuit according to the present current, the present bias voltage value, and the lower electrode-to-ground capacitance:

$$R_g = \sqrt{\left(\frac{V_0}{I_0}\right)^2 - \left(\frac{1}{\omega C}\right)^2} \text{ and } R_m = \frac{P_{low}}{I_0^2} - R_g;$$

wherein:
$R_g$ is the grounded equivalent resistance of the lower electrode RF circuit;
$R_m$ is the loss equivalent resistance of the lower electrode RF circuit;
$V_0$ is the present bias voltage value;
$I_0$ is the present current;
ω is the angular frequency;
C is the lower electrode-to-ground capacitance; and
$P_{low}$ is the determined power value.

9. The power control device according to claim 7, wherein the semiconductor processing includes a plurality of processing steps;

the power control device further comprising:
- a writing unit configured to, before performing the semiconductor processing, write pre-obtained $I_A$ and $I_S$ corresponding to the processing steps into a parameter table; and
- the calculation unit further configured to call $R_{mA}$, $R_{gA}$, $C_A$, $R_{mB}$, $R_{gB}$, and $C_B$, when the present processing chamber starts performing the processing steps, call $I_A$ and $I_S$ corresponding to a current processing step from the parameter table, and with the power compensation equation and according to $I_A$, $I_S$, $R_{mA}$, $R_{gA}$, $C_A$, $R_{mB}$, $R_{gB}$, and $C_B$, obtain the power compensation coefficient.

10. The power control device according to claim 6, wherein the calculation unit is configured to calculate a product of the power compensation coefficient and the power setting value as the power compensation value.

11. Semiconductor processing equipment comprising:
- a processing chamber, a lower electrode being arranged in the processing chamber;
- a matcher;
- a lower RF power supply, the lower electrode being electrically connected to the lower RF power supply through the matcher; and
- a power control device including:
  - a calculation unit configured to, when a processing chamber starts semiconductor processing, with a predetermined power compensation equation and according to a pre-obtained first RF circuit parameter set of a reference chamber and a second RF circuit parameter set of a present processing chamber performing the semiconductor processing, obtain a power compensation coefficient of the present processing chamber relative to the reference chamber, and according to the power compensation coefficient and a power setting value of the lower RF power supply of the present processing chamber, calculate a power compensation value of the present processing chamber relative to the reference chamber; and
  - a control unit configured to control the lower RF power supply to output the power compensation value;

wherein:
- the first RF circuit parameter set includes a current at an output end of a lower matcher in a main path of a lower electrode RF circuit of the reference chamber, a current in a plasma sheath branch of the lower electrode RF circuit of the reference chamber, a loss equivalent resistance and a ground equivalent resistance of the lower electrode RF circuit of the reference chamber, and a lower electrode-to-ground capacitance of the reference chamber; and
- the second RF circuit parameter set includes a loss equivalent resistance and aa grounded equivalent resistance of the lower RF circuit of the present processing chamber and a lower electrode-to-ground capacitance of the present processing chamber.

* * * * *